United States Patent
Esseni et al.

(10) Patent No.: US 6,734,490 B2
(45) Date of Patent: May 11, 2004

(54) NONVOLATILE MEMORY CELL WITH HIGH PROGRAMMING EFFICIENCY

(75) Inventors: David Esseni, Monterenzio (IT); Luca Selmi, Vignola (IT); Roberto Bez, Milan (IT); Alberto Modelli, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/919,341

(22) Filed: Jul. 30, 2001

(65) Prior Publication Data

US 2002/0033499 A1 Mar. 21, 2002

(30) Foreign Application Priority Data

Jul. 31, 2000  (EP) ............................................. 00830546

(51) Int. Cl.[7] ........................ H01L 29/788; G11C 16/04
(52) U.S. Cl. ....................... 257/315; 257/316; 257/314; 257/322; 257/378; 365/185.01; 365/185.18; 365/185.27; 365/185.28
(58) Field of Search ................................ 257/315, 316, 257/317, 318, 319, 322, 370, 378, 408, 362, 314, 361, 326; 438/257, 258, 266; 365/185.01, 185.18, 185.27, 185.28

(56) References Cited

U.S. PATENT DOCUMENTS

| | | | | |
|---|---|---|---|---|
| 5,060,194 A | * | 10/1991 | Sakui et al. ................. | 365/177 |
| 5,350,938 A | * | 9/1994 | Matsukawa et al. ......... | 257/378 |
| 5,659,504 A | | 8/1997 | Bude et al. ............. | 365/185.27 |
| 5,838,617 A | | 11/1998 | Bude et al. ............. | 365/185.18 |
| 5,867,425 A | | 2/1999 | Wong ..................... | 365/185.18 |
| 5,896,315 A | | 4/1999 | Wong ..................... | 365/185.01 |
| 6,459,119 B1 | * | 10/2002 | Huang et al. ................ | 257/314 |
| 6,507,066 B1 | * | 1/2003 | Hsu et al. .................... | 257/314 |

FOREIGN PATENT DOCUMENTS

| | | |
|---|---|---|
| JP | 56-21375 | 2/1981 |
| JP | 61123185 | 6/1986 |

OTHER PUBLICATIONS

Wijburg, R.C. et al., "VIPMOS—A Novel Buried Injector Structure for EPROM Applications," *IEEE Transactions on Electron Devices*, 38(1):111–120, Jan. 1991.

Eitan, B. et al., "Substrate Hot–Electron Injection EPROM," *IEEE Transactions on Electron Devices*, ED–31(7):934–942, Jul. 1984.

Tsuji, N. et al., New Erase Scheme for DINOR Flash Memory Enhancing Erase/Write Cycling Endurance Characteristics, *IEEE*, pp. 53–56, 1994.

Bude, J.D. et al., "Secondary Electron Flash—A High Performance, Low Power Flash Technology for 0.35 μm and Below," *IEEE*, pp. 1–4, 1997.

Lin, F.R. et al., "A Novel Hot Carrier Mechanism: Band–to–Band Tunneling Hole Induced Bipolar Hot Electron (BBHBHE)," *IEEE*, pp. 741–744, 1999.

\* cited by examiner

*Primary Examiner*—Jerome Jackson
*Assistant Examiner*—Matthew C. Landau
(74) *Attorney, Agent, or Firm*—Lisa K. Jorgenson; Robert Iannucci; Seed IP Law Group PLLC

(57) ABSTRACT

The memory cell is formed in a body of a P-type semiconductor material forming a channel region and housing N-type drain and source regions at two opposite sides of the channel region. A floating gate region extends above the channel region. A P-type charge injection region extends in the body contiguously to the drain region, at least in part between the channel region and the drain region. An N-type base region extends between the drain region, the charge injection region, and the channel region. The charge injection region and the drain region are biased by special contact regions so as to forward bias the PN junction formed by the charge injection region and the base region. The holes thus generated in the charge injection region are directly injected through the base region into the body, where they generate, by impact, electrons that are injected towards the floating gate region.

6 Claims, 2 Drawing Sheets

NONVOLATILE MEMORY CELL WITH HIGH PROGRAMMING EFFICIENCY

BACKGROUND OF THE INVENTION

1. Field of the Invention

The present invention regards a nonvolatile memory cell with high programming efficiency.

2. Description of the Related Art

As is known, flash memory cells are generally programmed by injecting channel hot electrons (channel hot electron programming, or CHE programming). However, this technique creates problems of scalability at supply voltages lower than 3.3 V on account of the drastic drop in injection efficiency when the applied voltage drops below the voltage corresponding to the barrier energy between silicon and silicon dioxide, which is 3.2 V.

To increase the injection efficiency, which constitutes a key parameter for obtaining a high writing speed (the so-called "memory bandwidth"), it has been proposed to use a new injection method, known as channel-initiated substrate-electron (CHISEL) programming, which is described, for instance, in U.S. Pat. No. 5,659,504 published on Aug. 19, 1997 and U.S. Pat. No. 5,838,617 published on Nov. 17, 1998, both in the name of Bude et al. According to this method, during programming, a negative voltage is applied to the cell substrate. This voltage increases the injection of tertiary electrons, generated by impact ionization of secondary holes in turn generated by impact ionization by channel electrons. Thanks to the non-zero generation energy of the tertiary electrons and to the voltage drop between the substrate and the interface region close to the drain region, the injection of tertiary electrons, promoted by the application of the negative voltage to the substrate, completely dominates the injection process, and all the more, the smaller the drain voltage.

In a typical cell of a 0.3 $\mu$m channel length technology, biased with a drain-to-source voltage Vds=4.5 V, and a source-to-body voltage Vsb=1 V, there are gate currents (injection current) Ig≅1–2 nA and hence writing speeds DVt/Dt≅1–2 V/s, with absorptions of drain current Ig≅50–150 $\mu$A, corresponding to an injection efficiency Ig/Id of the order of $10^{-5}$.

The above low injection efficiency is due to the fact that the injection process is intrinsically the fruit of three distinct cascaded processes, each of which typically has an efficiency much lower than unity; these are:

1) generation of secondary holes by channel electrons, injected by the source region and flowing towards the drain region;
2) generation of tertiary electrons deep within the substrate of the device by secondary holes in motion towards the substrate terminal;
3) heating of the tertiary electrons in motion towards the drain/substrate interface, and their injection into the floating gate region through the tunnel oxide.

There have moreover been proposed various cell structures which use in different ways the injection of tertiary electrons from the substrate in an attempt to increase the efficiency of the injection process. These structures are based on the integration of appropriate injectors of electrons in the substrate and in the collection of these charge carriers within the depleted region beneath the floating gate of the memory cell. The injectors may be formed by buried layers; see, for example, the erasing scheme for triple well DINOR cells (N. Tsuji et al., "A New Erase Scheme for DINOR Flash Memory Enhancing Erase/Write Cycling Endurance Characteristics", Proc. IEDM, 1994, page 53) or else the VIPMOS cell (R. C. Wijburg et al., "VIPMOS, A Novel Buried Injector Structure for EPROM Applications", Trans Electron Devices, 1991, vol. 38, No. 1, page 111), with writing obtained by punch-through from the buried pocket. Alternatively, the injectors can be formed by lateral bipolar transistors (see, for instance, B. Eitan et al., "Substrate Hot Electron Injection EPROM", Trans Electron Devices, 1984, vol. 31, No. 7, page 934).

The known solutions listed above present, however, one or more of the following considerable disadvantages:

1) low collection efficiency of the charge carriers injected by the depleted region formed beneath the floating gate region;
2) efficiency drop with the reduction of transistor size, in that the source and drain areas become a more important fraction of the total area of the device;
3) poor or no injection selectivity; consequently, during programming of a specific cell it is possible to disturb, i.e., program at least partially other cells of the array having the same substrate.

SUMMARY OF THE INVENTION

An embodiment of the invention provides a memory cell that is programmable in an efficient way.

BRIEF DESCRIPTION OF THE DRAWINGS

For an understanding of the present invention, a preferred embodiment thereof is now described, only as a non-limiting example, with reference to the attached drawings, wherein.

DETAILED DESCRIPTION OF THE INVENTION

Figure 1:
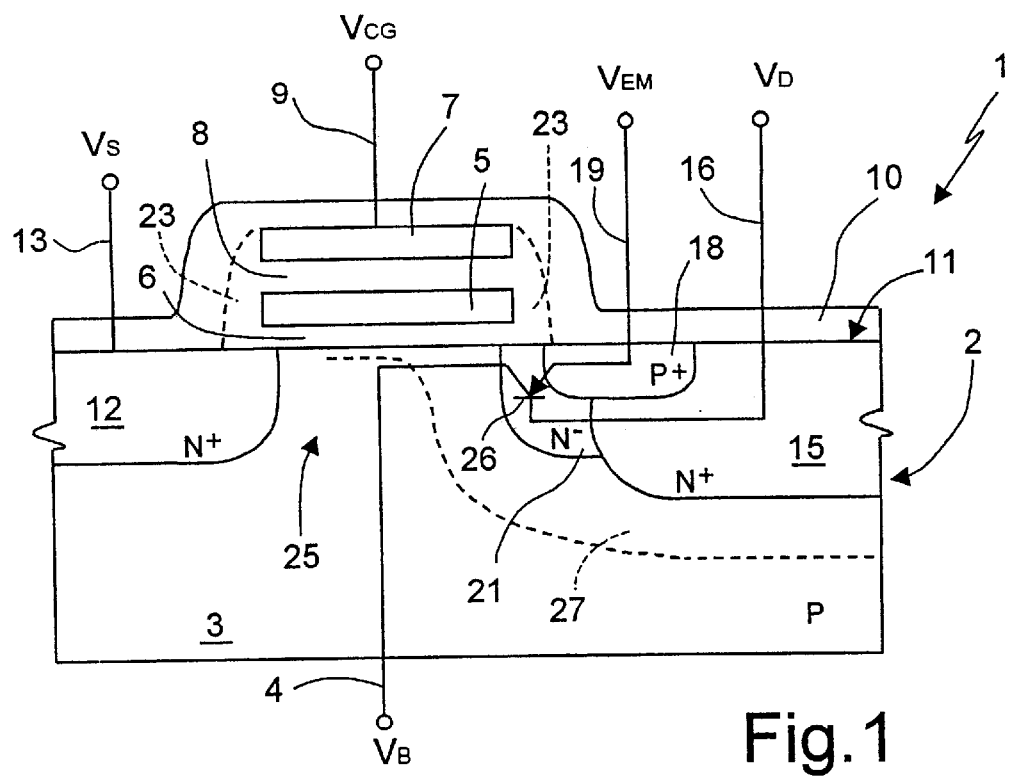
FIG. 1 shows a cross-section through a memory cell according to the invention.

FIG. 1 shows a memory cell 1 formed in a chip 2 including a substrate 3 of P-type semiconductor material (silicon) biased at a bulk voltage $V_B$ via a bulk contact 4. A floating gate region 5 extends above the substrate 3 and is insulated from the latter by a tunnel region 6 formed by a thin insulating layer, for instance, of oxide; a control gate region 7 extends above the floating gate region 5 and is insulated from the latter by an interpoly dielectric region 8. The control gate region 7 is biased at a gate voltage $V_{CG}$ by a control contact 9, generally formed at one end of a word line, of polysilicon, common to various cells. A protection layer 10, of oxide or some other insulating material, surrounds the gate regions 5, 7.

A source region 12, of $N^+$ type, extends in the substrate 3 on one first side of the floating gate region 5, substantially aligned with the latter (apart from a slight overlapping, due to lateral diffusion, in a per se known manner), and is biased at a source voltage $V_S$ through a source contact 13. A drain region 15, also of $N^+$ type, extends in the substrate 3 on a second side of the floating gate region 5, at some distance from the latter. The drain region 15 is biased at a drain voltage $V_D$ by a drain contact 16.

An emitter region 18 extends in the substrate 3, in part surrounded by the drain region 15, in part protruding out towards the source region 12, without, however, extending beneath the floating gate region 5; the emitter region 18 is of P type and has a smaller depth than the drain region 15. The emitter region 18 is biased at an emitter voltage $V_{EM}$ through an emitter contact 19. A base region 21, of N⁻ type, extends in the substrate 3, below the emitter region 18 and on the side of the latter facing the source region 12, so that the emitter region 18 is completely surrounded (except on the side facing a surface 11 of the substrate 3) by regions of opposite conductivity, and forms with the latter a PN junction. The base region 21 is substantially aligned with one of its sides to the gate region 5, as permitted by the lateral diffusion.

The source region 12 and the base region 21 thus laterally delimit, within the substrate 3, a channel region 25.

The emitter region 18, the base region 21, and the substrate 3 (collector) in practice form a bipolar transistor 26 of PNP type.

The presence of the bipolar transistor 26 enables implementation of a mechanism that reduces from three to two the number of steps necessary for injecting electrons in the floating gate region 5—as illustrated schematically in FIG. 2—which has the same structure as the memory cell 1, and which is described hereinafter.

For programming the memory cell 1, the PN junction formed by the emitter region 18 and the base region 21 is forward biased. In particular, between the emitter region 18 (biased at the emitter voltage $V_{EM}$) and the base region 21 (biased at the drain voltage $V_D$) a positive potential difference $V_{EM}-V_D$ is applied. In addition, the gate voltage $V_{CG}$ is set at 8–12 V with respect to the bulk voltage $V_B$; between the drain voltage $V_D$ and the bulk voltage $V_B$ a positive potential difference $V_D-V_B$ is applied, for example, between 2.5 and 5 V; the source voltage is at the same voltage as the drain voltage; and the substrate 3 is, for instance, grounded.

Figure 2:
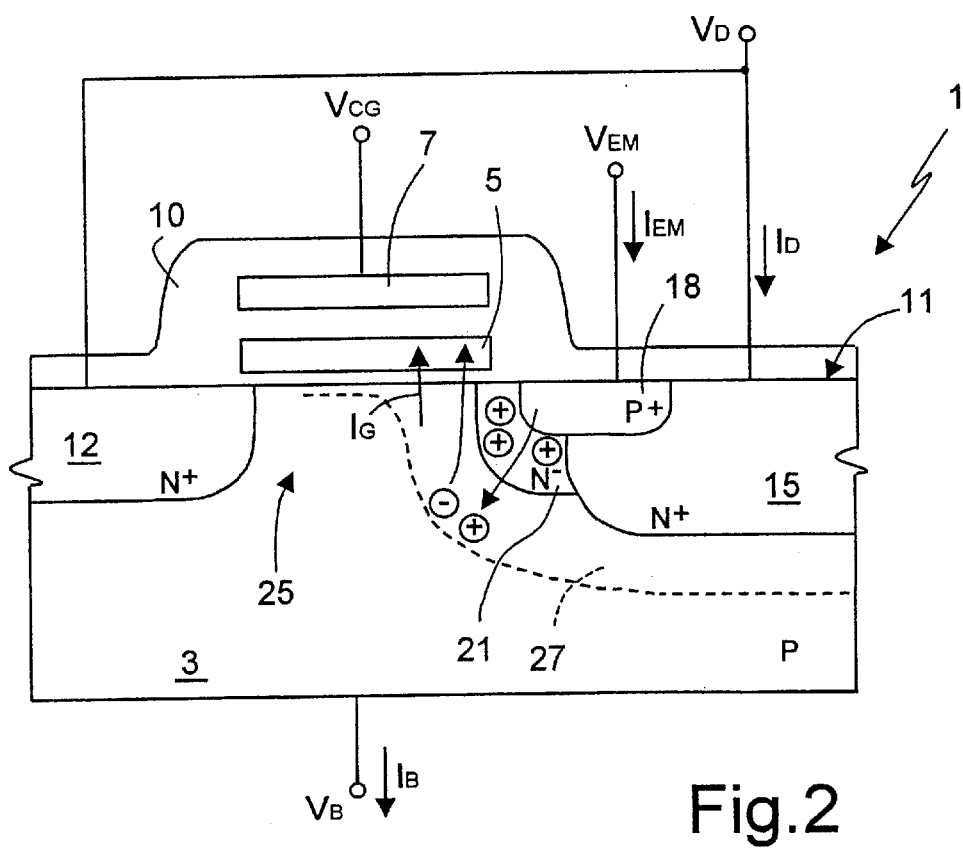
FIG. 2 shows the same cross-section of FIG. 1 and shows the charge carrier flow.

In this condition, the bipolar transistor 26 is on, and the holes in the emitter region 18 migrate towards the base region 21 and the substrate 3, in particular towards the depleted region 27, the bounds of which are represented by a dashed line; here, the injected holes generate, by impact ionization, secondary electrons which are accelerated by the existing field towards the surface 11 of the substrate; a part of the secondary electrons is then injected towards the floating gate region 5, as represented schematically in FIG. 2, according to a mechanism similar to that of hot electron injection from the substrate.

The memory cell 1 thus replaces the inefficient generation of holes by the channel electrons with their direct injection from the emitter region 18 (which thus defines a charge injection region) into the channel region 25. If the source region 12 is maintained at the same potential as the drain region 15 and the base region 21, also the need for a channel current during programming is eliminated, and consequently consumption is reduced.

If, moreover, a high potential difference is maintained between the base region 21 and the floating gate region 5 (the latter being capacitively coupled with the control gate region 7), in addition a high efficiency of secondary electron injection is achieved.

In particular, if the common base gain of the bipolar transistor 26 is assumed equal to unity, it is possible to express the efficiency of the memory cell 1, defined as the ratio between the current $I_G$ of electrons injected into the floating gate region 5 and the bulk current $I_B$ flowing from the substrate 3 towards the bulk terminal 4 (the bulk current $I_B$ is the highest of the currents to the other terminals), as follows:

$$I_G/I_B = Pb(Mp-1)/Mp$$

where Mp is the hole multiplication coefficient within the depleted region 27, and Pb is the probability of the electrons generated in the substrate 3 being injected in the floating gate region 5.

From simulations carried out it has thus been found that, for values of Mp between 1 and 2 and values of $(I_B/I_D)$ of the order of $10^{-2}$, given the same value of Pb, the efficiency of the memory cell 1 is much higher than that of known cells with hot electron programming.

Reading the memory cell 1 is performed in a traditional way (setting, for example, $V_{CG}$=5–6 V, $V_D$=1 V, $V_S$=$V_B$=0 V) and leaving the emitter region 18 floating. Alternatively, the emitter region 18 may be biased at a voltage lower than or equal to the drain voltage $V_D$.

Figure 3:
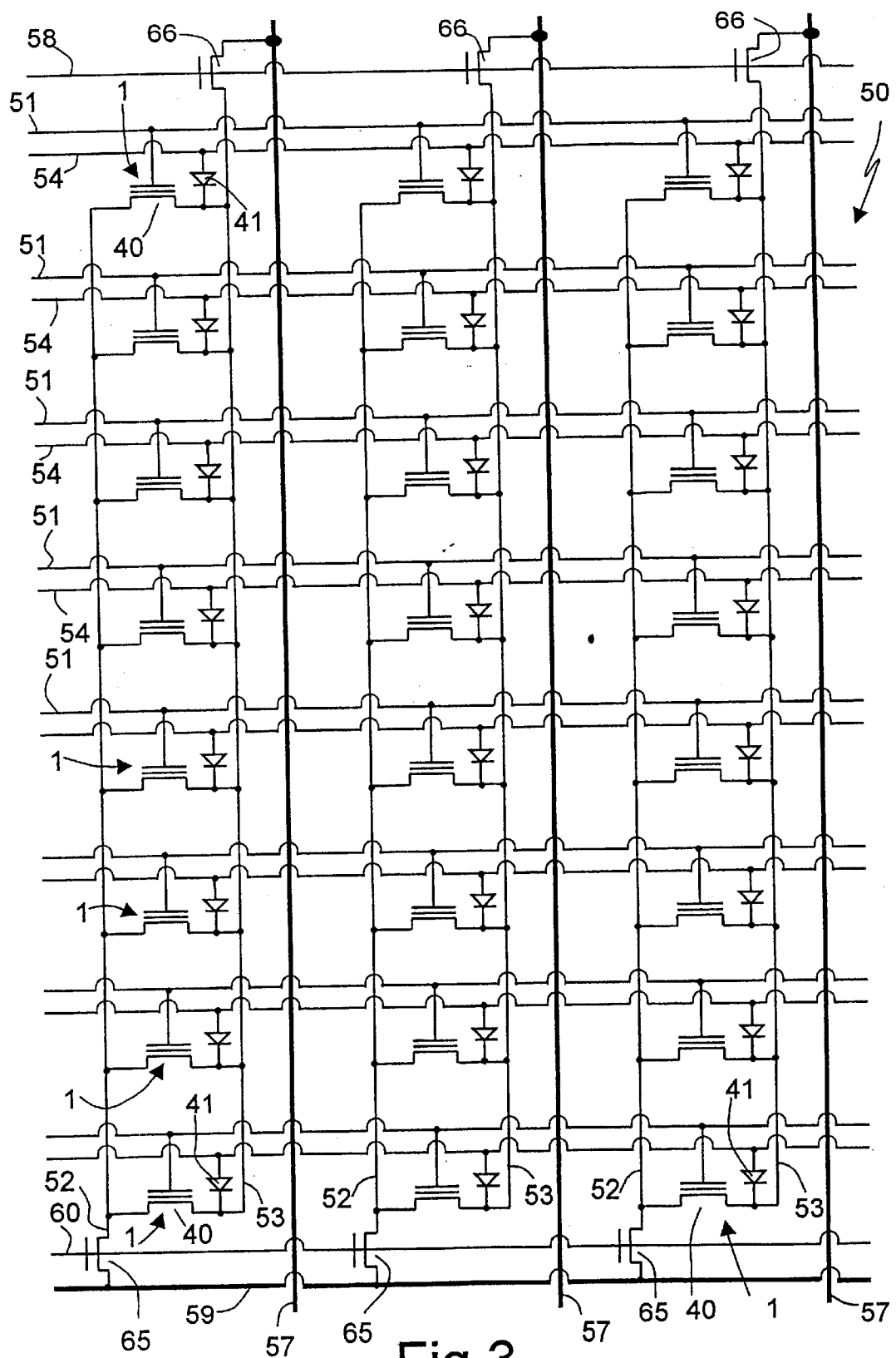
FIG. 3 presents the architecture of a memory cell array according to the present invention.

FIG. 3 illustrates an embodiment of the architecture of a memory array 50 formed by a plurality of memory cells 1 of the above described type. The architecture illustrated in FIG. 3 may be implemented using a standard process for stacked gate flash memories that uses two polysilicon levels and three metal levels.

The memory cells 1 are arranged in rows and columns and are each represented by a nonvolatile cell 40 and by a diode 41, the anode of which represents the emitter region 18 and the cathode of which (the base region 21 in FIG. 1) is connected to the drain terminal of the flash cell 40.

FIG. 3 illustrates a portion of the array 50 in which all the memory cells 1 have their source regions biased at a same voltage, and in particular may be erased only simultaneously in a per se known manner. The shown sector comprises a plurality of word lines 51, a plurality of local source lines 52, a plurality of local bit lines 53, a plurality of emitter lines 54, a plurality of main bit lines 57, a drain selection line 58, a main source line 59, and a source selection line 60.

In particular, the memory cells 1 arranged in a same row have control gate regions (7 in FIG. 1) connected together by a same word line 51, and emitter regions (18 in FIG. 1, represented by the cathodes of the diodes 41) connected together by a same emitter line 54. In addition, the memory cells arranged in a same column have source regions (12 in FIG. 1) connected together through a same source line 52, and drain regions (15 in FIG. 1) connected together through a same bit line 53.

The local source lines 52 are connected to the main source line 59 by pass gates 65 formed by NMOS selection transistors, the control terminals whereof are connected to the source selection line 60; the local bit lines 53 are connected to respective main bit lines 57 by gates 66 formed by NMOS selection transistors the control terminals whereof are connected to the drain selection line 58.

In the memory array 50 illustrated in FIG. 3, the floating gate regions (5 in FIG. 1) are formed using a first polysilicon layer (poly1); the word lines 51, the drain selection line 58 and the source selection line 60 are formed using a second polysilicon layer (poly2); the emitter lines 54 and the main source line 59 are formed using a first metal level; the local source lines 52 and the local bit lines 53 are formed using a second metal level; finally, the main bit lines 57 are formed using a third metal level.

The memory cell 1 is manufactured, for example, according to the following processing steps: initially, the active areas are defined; next, a tunnel oxide layer is deposited; the poly1 layer is deposited; the poly1 layer is defined to form the floating gate regions 5; an interpoly oxide layer is formed; the poly2 layer is deposited; the poly2 layer is defined to form the gate lines 51 (and then the control gate regions 7) and the bit selection and source selection lines 58, 60 (and then the gate regions of the source selection transistor 65 and gate selection transistor 66); the source region 12, base region 21, and drain region 15 are separately implanted; spacers are formed (represented by the dashed lines 23 in FIG. 1), and then the emitter regions 18 are implanted; the protective layer 10 is deposited; the source contact 13, drain contact 16, and emitter contact 19 are formed; the first metal layer is deposited and defined to form the emitter lines 54 and the vias towards the source contact 13 and drain contact 16; a first insulation layer is formed; the second metal layer is deposited and defined to form the local source and local bit lines 52, 53; a second insulation layer is formed; the third metal layer is deposited and defined to form the main bit lines; finally, the customary final operations are carried out.

The advantages of the memory cell described herein are illustrated hereinafter. First, the memory cell has a much higher efficiency level than known cells, as discussed previously, at the same time preserving programming selectivity.

The lower doping level of the base region 21 as compared to that of the drain region 15 contributes to bestowing high efficiency, confining injection of holes generated by the emitter region 18 towards the substrate 3. In fact, the base region 21 determines a lateral doping gradient that favours injection of holes from the emitter region 18 towards the channel region 25, through the base region 21 with respect to injection towards the drain region 15.

The arrangement of the base region 21 misaligned (at least partially) with respect to the floating gate region 5 prevents turning-on of a parasitic PMOS transistor formed by the emitter region 18 and the substrate 3 (operating as source/drain) and having the base region 21 as channel. The parasitic PMOS transistor cannot in fact turn on in the absence of total overlapping between the floating gate region 5 and the base region 21.

Finally, it is clear that numerous variations and modifications may be made to the memory cell described and illustrated herein, all of which fall within the scope of the invention as defined in the attached claims. In particular, the base region 21 does not need to be distinct from and have a lower level of doping than the drain region 15. For example, the base region 21 could be formed by a portion of the drain region 15, provided that the latter is appropriately shaped so as to surround the emitter region 18 on all sides. In this case, in order to increase the hole injection efficiency towards the channel region 25 instead of towards the drain contact 16, it is possible to bias the drain region 15 and source region 12 so as to create a positive voltage drop towards the drain region 15. In this way, a current is generated that flows from the drain region 15 as far as the source region 12, passing beneath the emitter region 18 and traversing the channel region 25. This current causes, beneath the emitter region 18 and in the portion of the drain region 15 facing the channel region 25, a lateral voltage drop that leads to a preferential injection of holes towards the base region 21 instead towards the drain region 15.

In addition, the depth of the base region 21 may indifferently be greater than, equal to, or smaller than that of the drain region 15.

Although the illustrated embodiment regards a flash cell, the invention can be applied also to other types of nonvolatile memories, such as EPROM and EEPROM memories; in the latter case, a selection transistor must be added for each memory cell.

Finally, the local source line 52 could be made in the same way as the diffused region in the substrate, and the source contact 13 could be provided only at the end of the aforesaid diffused region.

We claim:

1. A memory cell, comprising;

a body of semiconductor material having a first conductivity type, the body forming a channel region;

a first and a second conductive region, having a second conductivity type and formed in the body on two opposite sides of the channel region;

first and second biasing terminals respectively in contact with the first and second conductive regions;

a floating gate region extending above the channel region;

a charge injection region having the first conductivity type, formed within the first conductive region such that a first portion of the first conductive region extends between the channel region and the charge injection region; and a third biasing terminal, distinct from the first and second biasing terminals, and in contact with the charge injection region.

2. The memory cell of claim 1 wherein the charge injection region does not totally overlap the floating gate region.

3. The memory cell of claim 1 wherein the first portion has a delimiting side facing the channel region and roughly aligned to the floating gate region.

4. A memory cell, comprising:

a body of semiconductor material having a first conductivity type, the body forming a channel region;

a first and a second conductive region, having a second conductivity type and formed in the body on two opposite sides of the channel region;

first and second biasing terminals respectively in contact with the first and second conductive regions;

a floating gate region extending above the channel region;

a charge injection region having the first conductivity type, formed within the first conductive region such that a first portion of the first conductive region extends between the channel region and the charge injection region; and a third biasing terminal in contact with the charge injection region, wherein the first conductive region includes a second portion that extends below and on an opposite side of the charge injection region with respect to the first portion and contacts the first portion, the second portion being doped at a higher level than the first portion.

5. A memory cell, comprising:

a floating gate transistor formed in and on a semiconductor substrate, the floating gate transistor including first and second conductive regions formed in the substrate on opposite sides of a channel region, a floating gate formed above the channel region, and first and second bias terminals connected to the first and second conductive regions, the substrate having a first conductivity type and the first and second conductive regions having a second conductivity type; and a bipolar transistor having a first conductive region with the first conductivity type formed within the first conductive region of the floating gate transistor and a conductive region terminal connected to the first conductive region of the bipolar transistor, the conductive region terminal being distinct from the first and second bias terminals, wherein the first conductive region of the floating gate transistor includes a base region that extends between the first conductive region of the bipolar transistor and the channel region such that the channel region forms a second conductive region of the bipolar transistor.

6. The memory cell of claim 5 wherein the first conductive region of the floating gate transistor includes a portion that extends below and on an opposite side of the first conductive region of the bipolar transistor with respect to the base region and contacts the base region, the portion being doped at a higher level than the base region.

* * * * *